US 6,724,835 B1

(12) United States Patent
Shenoi

(10) Patent No.: US 6,724,835 B1
(45) Date of Patent: Apr. 20, 2004

(54) CARRIER TRACKING METHOD

(75) Inventor: Kishan Shenoi, Saratoga, CA (US)

(73) Assignee: Symmetricam, Inc., San Jose, CA (US)

( * ) Notice: Subject to any disclaimer, the term of this patent is extended or adjusted under 35 U.S.C. 154(b) by 0 days.

(21) Appl. No.: 09/344,301

(22) Filed: Jun. 24, 1999

Related U.S. Application Data

(60) Provisional application No. 60/130,203, filed on Apr. 20, 1999.

(51) Int. Cl.[7] .............................................. H04L 27/14
(52) U.S. Cl. ..................................................... 375/326
(58) Field of Search ................................ 375/316, 136, 375/137, 326, 327, 324, 373, 376; 329/306, 307, 308, 375, 346; 455/138, 136, 164.1, 164.2, 173.1, 182.1, 182.2, 192.2, 203

(56) References Cited

U.S. PATENT DOCUMENTS

| 3,965,428 | A | * | 6/1976 | Katz et al. ...................... 327/14 |
| 4,121,212 | A | * | 10/1978 | Taylor, Jr. ...................... 342/201 |
| 4,809,005 | A | * | 2/1989 | Counselman, III .......... 342/352 |
| 5,327,144 | A | * | 7/1994 | Stilp et al. .................... 342/387 |
| 5,432,819 | A | * | 7/1995 | Mui ............................. 375/329 |
| 5,978,488 | A | * | 11/1999 | Margolin ....................... 381/61 |
| 5,982,821 | A | * | 11/1999 | Kingston et al. ............ 329/315 |
| 6,163,294 | A | * | 12/2000 | Talbot ........................... 33/292 |
| 6,304,620 | B1 | * | 10/2001 | Rouphael ..................... 375/344 |
| 6,310,925 | B1 | * | 10/2001 | Kitta ............................ 375/326 |
| 6,324,228 | B1 | * | 11/2001 | Millward et al. ............ 375/344 |
| 6,383,139 | B1 | * | 5/2002 | Hwang et al. ............... 600/441 |
| 6,404,825 | B1 | * | 6/2002 | Efstathiou .................... 375/326 |

FOREIGN PATENT DOCUMENTS

| DE | 32 10078 C1 | 11/1983 | ............ H03J/7/04 |
| EP | 0 788 225 A1 | 8/1997 | ............ H03J/7/04 |
| WO | WO 99/23759 | 5/1999 | ............ H03J/7/04 |

* cited by examiner

Primary Examiner—Emmanuel P Bayard
(74) Attorney, Agent, or Firm—Gray Cary Ware & Freidenrich, LLP

(57) ABSTRACT

Systems and methods are described for carrier tracking. A center frequency of a signal is tracked by comparing spectral power contents of filtered versions of the signal. A receiver incorporates this carrier tracking. The systems and methods provide advantages because of decreased cost.

42 Claims, 3 Drawing Sheets

CARRIER TRACKING METHOD

CROSS-REFERENCE TO RELATED APPLICATION

This application is a continuation-in-part under 35 U.S.C. § 120 of U.S. Ser. No. 60/130,203, filed Apr. 20, 1999, the entire contents of which are hereby incorporated herein by reference as if fully set forth herein.

BACKGROUND OF THE INVENTION

1. Field of the Invention

The invention relates generally to the field of carrier tracking. More particularly, the invention relates to symmetrical (balanced) carrier tracking.

2. Discussion of the Related Art

Carrier tracking, or "clock recovery", is a fundamental process in all high performance receivers, regardless of whether the information is "analog" (such as speech, etc.) or "digital" (i.e. digital data). The receiver must establish the frequency of the transmitter's oscillator, denoted by $f_{CT}$. If $f_{CR}$ is the receiver's estimate of the transmit carrier frequency, the performance degradation is directly related to the difference $|f_{CT}-f_{CR}|$. Thus the ability to accurately estimate the carrier frequency is important for good system performance. For a variety of reasons, such as oscillator drift, Doppler effects, and so on, the effective carrier frequency may change with time and the receiver must follow these changes. This tracking is achieved using a servo loop often referred to as the carrier tracking loop. The principal components of a carrier tracking loop include an NCO (or a VCO), the output of which is representative of the carrier frequency estimate, a means to generate an "error" signal representative of the difference ($f_{CT}-f_{CR}$), and a "loop filter" to smooth out noise from this error estimate. The loop is closed by using this smoothed error signal to drive the NCO.

A disadvantage of this approach has been relatively high cost. Therefore, what is needed is a solution that meets the above-discussed requirements in a more cost effective manner. The invention is directed to meeting these requirements, among others.

SUMMARY OF THE INVENTION

A goal of the invention is to satisfy the above-discussed requirement of economy.

One embodiment of the invention is based on a method for tracking a center frequency of a signal having substantially equal spectral power content on both sides of the center frequency, comprising: making an estimate of the center frequency; filtering the signal to produce a first output having a first spectral power content and a second output having a second spectral power content; and revising the estimate of the center frequency based on a difference between the first spectral power content and the second spectral power content.

Another embodiment of the invention is based on an apparatus for tracking a center frequency of a signal having substantially equal spectral power content on both sides of the center frequency, comprising: a first filter for producing a first output from the signal; a second filter for producing a second output from the signal, such that the second filter is matched with the first filter; and a set of processing resources for making an estimate of the center frequency, calculating the spectral power contents of the first output and the second output, and revising the estimate of the center frequency based on a difference between the spectral power contents of the first output and the second output, such that the set of processing resources is coupled to the first filter and the second filter.

These, and other, goals and embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF THE DRAWINGS

A clear conception of the advantages and features constituting the invention, and of the components and operation of model systems provided with the invention, will become more readily apparent by referring to the exemplary, and therefore nonlimiting, embodiments illustrated in the drawings accompanying and forming a part of this specification. It should be noted that the features illustrated in the drawings are not necessarily drawn to scale.

DESCRIPTION OF PREFERRED EMBODIMENTS

The invention and the various features and advantageous details thereof are explained more fully with reference to the nonlimiting embodiments that are illustrated in the accompanying drawings and detailed in the following description of preferred embodiments. Descriptions of well known components and processing techniques are omitted so as not to unnecessarily obscure the invention in detail.

The context of the invention includes global positioning systems. The invention can also utilize data processing methods that transform the carrier tracking signals so as to actuate interconnected discrete hardware elements; for example, to modify the operation of a global positioning system.

The invention includes implementing a carrier tracking loop. The carrier tracking loop is applicable when the modulation exhibits "symmetry", or "balance". The underlying principle is that the spectral power content in such cases is equal on either side of the true carrier frequency and by detecting the difference in the power of the upper sideband and the power of the lower sideband a correction signal can be derived and applied to actuate a numerically controlled oscillator (NCO) or voltage controlled oscillator (VCO). Whereas the principle underlying the technique is independent of the technology used for implementation, a DSP (Digital Signal Processing) based method is preferred because the technique requires two bandpass filters with different center frequencies that should be matched. This requirement for matching can be satisfied using DSP in a straightforward manner but may be difficult to satisfy using analog techniques.

The method described here provides the error signal required to close a carrier tracking loop. The method described is applicable in all cases where the modulation is "symmetric" or "balanced." These "symmetric" or "balanced" terms are used to describe the spectrum of the modulated signal. The notion of "symmetric" or "balanced" modulation refers to the spectral power content on either side of this center frequency being equal, (i.e., the sidebands are of equal power).

Figure 1:
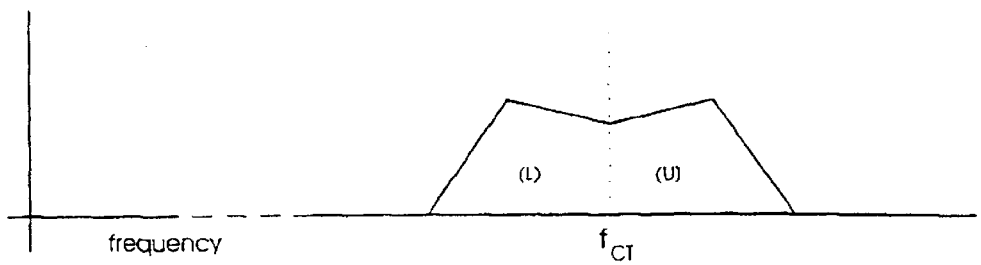
FIG. 1 illustrates a spectrum of an exemplary modulated (composite) signal, representing an embodiment of the invention.

For example, the spectrum of the modulated (composite) signal can be depicted as in FIG. 1. The transmitter carrier frequency defines a "center" with the power of the signal spread over a band of frequencies. The band of frequencies is usually narrow compared to the magnitude of the carrier frequency. The band of frequencies is located around this "center" frequency. The "center" frequency may correspond to a radio frequency (RF) carrier. The "center" frequency may also be any other frequency in the electromagnetic spectrum. In FIG. 1 we consider only the positive half of the frequency axis is considered since, in most cases, the transmitted signal will be real-valued and thus exhibit a conjugate symmetry about zero frequency.

FIG. 1 shows a representative power spectrum of the modulated signals, received by an antenna. The antenna can be coupled to an oscillator for making an estimate of the center frequency. "U" and "L" denote the upper and lower sidebands. The center frequency is the transmit carrier, $f_{CT}$. The power content of the sidebands will be equal if the modulation is balanced. Only the positive frequency scale is shown.

Figure 2:
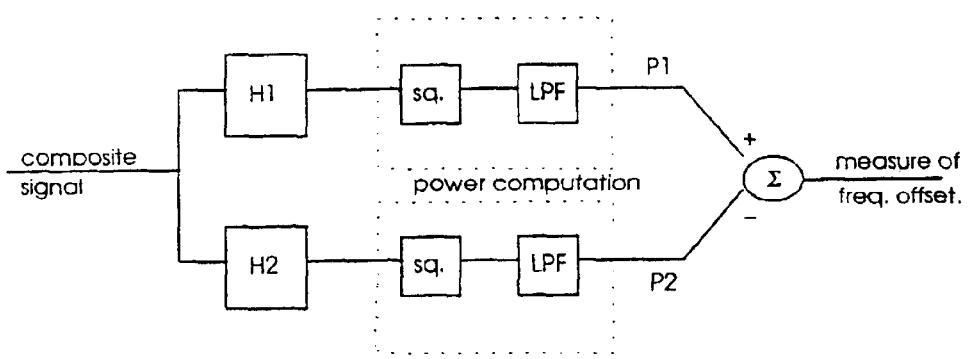
FIG. 2 illustrates a block schematic view of a signal processing apparatus having two filters in parallel, representing an embodiment of the invention.

In more detail where the composite signal is applied to two filters, $H_1$ and $H_2$, in parallel, the power of the outputs of these two filters can be computed and compared. If the filter characteristics $H_1$ and $H_2$ are symmetric about the center frequency $f_{CR}$, then the powers $P_1$ and $P_2$ will be equal. If they are symmetric about a frequency offset from the carrier frequency, then the difference in powers will be a measure of (i.e. monotonically related to) the frequency offset. It is important to note that this is true whether a carrier component is present or not. That is, the technique is applicable for carrier recovery when the modulation scheme retains a carrier component as well as for modulation schemes of the suppressed carrier type. Referring to FIG. 2, if $H_1$ and $H_2$ are symmetric about $f_{CR}$, then the difference between $P_1$ and $P_2$ is a measure of the difference ($f_{CT}-f_{CR}$).

Thus, the technique includes making an estimate of a center frequency of a signal, filtering the signal to produce two outputs each having a spectral power content, and revising the estimate based on a difference between the spectral power contents of the two outputs. The filtering may use two filters matched with each other. The two outputs are depicted in FIG. 2 as being computed in parallel, but they may be computed sequentially as well.

Figure 3:
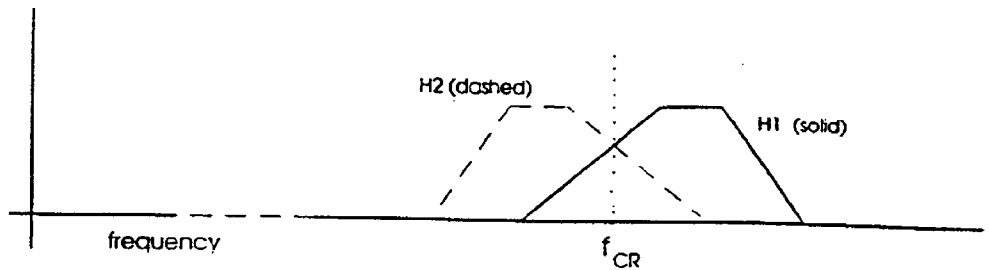
FIG. 3 illustrates generic shapes for the frequency responses of the two filters depicted in FIG. 2.

Referring to FIG. 3, the generic shapes of the frequency responses of $H_1$ and $H_2$ are depicted. Note that they exhibit symmetry about $f_{CR}$ in much the same way that the upper and lower sidebands of the composite signal display symmetry about $f_{CT}$. Since the outputs of the filters $H_1$ and $H_2$ are not used to extract the information signal, there is no specific requirement of the shapes of their frequency response (other than their relative symmetry). While $H_1$ is nominally extracting the upper sideband ("U") and $H_2$ is extracting the lower sideband ("L"), the filters do not have to cutoff sharply, or even substantially, to reject the other sideband. Of course, $H_1$ and $H_2$ may be constructed to sharply or substantially reject the lower and upper sidebands, respectively. Furthermore, they do not necessarily have to encompass the complete extent of the sideband they are selecting. More specifically, they can be constructed to extend beyond the sideband they are selecting. The (nominal) bandwidth of the filters can be less than the bandwidth of a sideband (being balanced modulation, the sidebands; have equal bandwidth).

FIG. 3 shows responses that have a "flat-top", usually associated with bandpass filters. To avoid pathological situations, such as when the information signal is a coherent tone in a DSB-AM (Double Side Band Amplitude Modulation) case, it may be preferable to have filters that are more "triangular" than "flat". In the pathological case mentioned, the width of the "flat" portion of the filters is equivalent to the frequency offset that can go undetected. Pulse-shaped filters may also be used.

The term coupled, as used herein, is defined as connected, although not necessarily directly, and not necessarily electrically or mechanically. The term substantially, as used herein, is defined as approximately (e.g., preferably within 10% of, more preferably within 1% of, most preferably within 0.1% of). The phrase spectral power content, as used herein, is defined as an integral of a spectral power density curve, which is found by multiplying a signal in the frequency domain by its complex conjugate. The phrase finite impulse response filter, as used herein, is defined as a filter implemented by convolution and producing an output, that is a weighted sum of current and past inputs. The phrase infinite impulse response filter, as used herein, is defined as a filter implemented by recursion and producing an output that is a weighted sum of current and past inputs and past outputs. The term pulse-shape, as used herein, is defined as a difference between a step function and a shifted version of the step function.

EXAMPLE

A specific embodiment of the invention will now be further described by the following, nonlimiting example which will serve to illustrate in some detail various features of significance. The example is intended merely to facilitate an understanding of ways in which the invention may be practiced and to further enable those of skill in the art to practice the invention. Accordingly, the example should not be construed as limiting the scope of the invention.

Figure 4:
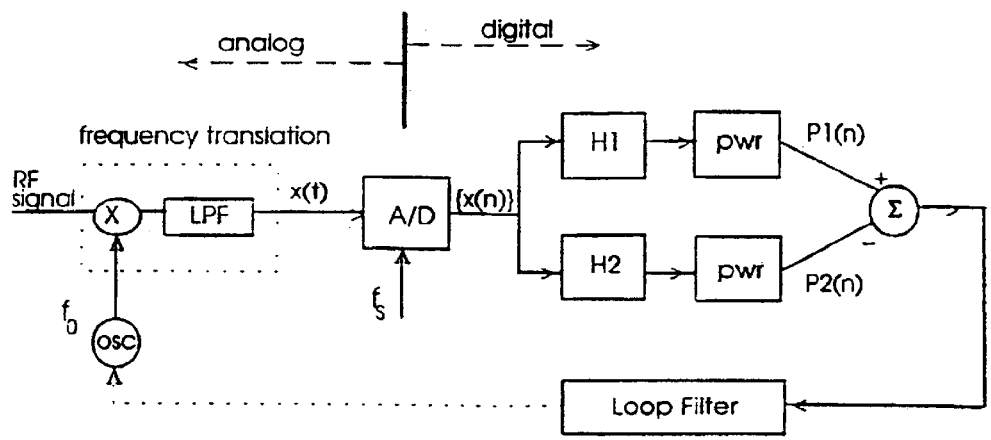
FIG. 4 illustrates a block schematic diagram of a signal processing apparatus having an analog to digital converter and two filters in parallel, representing an embodiment of the invention.

Implementing the filters at the RF carrier frequency may sometimes not be practical. Consequently, a frequency translation can be used such that the carrier is shifted to a lower frequency (which is still referred to as $f_{CT}$ for convenience. The shifting may also be performed on a suppressed carrier signal. If the frequency of the oscillator used in the translation is $f_0$, then the true carrier frequency is $f_{CT}+f_0$. The translation process is depicted in FIG. 4 as a single stage transformation, though in practice a multi-stage implementation may be used. The composite (shifted) signal is x(t). The spectral content of x(t) is depicted in FIG. 5 where $f_{CT}$ represents the shifted carrier frequency.

Since implementing filters of precise shape is much more convenient using DSP, this (shifted) signal is advantageously converted to digital form using an A/D converter at a sampling rate $f_s$ and sufficient word length to preserve the essential features of the signal. The A/D converter is coupled to the antenna. If the quantization noise is significant, it should be essentially white noise so as to affect the sidebands equally. Noise-shaping converters, such as delta-sigma-modulators, may be inappropriate in this application. The sampling rate used in the A/D converter is fixed and locked to the master time-base of the receiver. The sampled version of x(t) is called {x(n)}.

Again referring to FIG. 4, two digital filters $H_1$ and $H_2$ are applied to the composite signal {x(n)} and the results of power computation is compared to generate an error signal which is subsequently smoothed to provide a control signal to alter the frequency $f_0$ of the local carrier-tracking oscillator. The two digital filters are coupled to the A/D converter. FIG. 4 depicts the analog oscillator involved in the frequency translation as the controlled oscillator of the servo loop, thereby implying a VCO implementation. The servo loop is only one possible implementation of a loop filter for smoothing out noise in the error estimate. An alternate approach is to keep this analog oscillator fixed (and locked to the time-base of the receiver) and introduce a digital frequency shift after the A/D converter.

Figure 5:
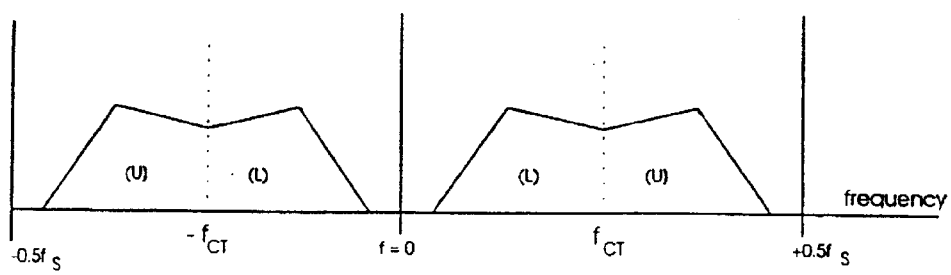
FIG. 5 illustrates the spectral content of a down-shifted signal, representing an embodiment of the invention.

FIG. 5 shows the spectral content of the signal x(t) which is obtained by shifting the RF signal to baseband. The actual carrier frequency shifts to $f_{CT}$. Clearly the frequency translation does not destroy the balanced property of the modulation. Also shown in FIG. 5 is the notion of 0.5 $f_s$, (i.e., half the sampling frequency). The sampling frequency must be high enough to encompass the extent of the upper sideband. Actually, if the sampling frequency is not high enough some aliasing may occur, which may not be of great significance, if the aliased components lie within the stopbands of $H_1$ and $H_2$.

Figure 6:
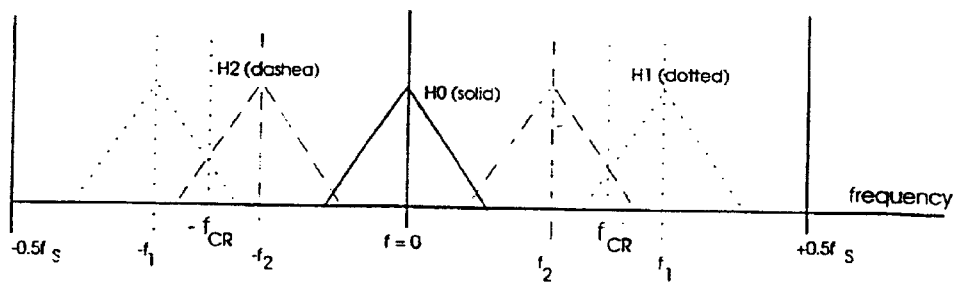
FIG. 6 illustrates frequency responses, representing an embodiment of the invention.

The digital filters $H_1$ and $H_2$ can be constructed using a prototype filter $H_0$ as a basis and translating the frequency response by an appropriate amount. The relevant frequency responses of $H_0$, $H_1$, and $H_2$ are depicted in FIG. 6.

Frequency response of $H_0$ is a prototype "lowpass" filter which is symmetric about f=0 (i.e. real-valued coefficients). $H_1$ and $H_2$ are bandpass filters obtained by translating the prototype response by $f_1$ and $f_2$, respectively.

The center frequencies of the filters $H_1$ and $H_2$ are given by $f_1$ and $f_2$, respectively, which are obtained as $$f_1 = f_{CR} + \Delta f; f_2 = f_{CR} - \Delta f$$

where $f_{CR}$ is a center frequency and $\Delta f$ is a change in frequency.

By generating the prototype filter using real-valued coefficients, we are guaranteed to have (conjugate) symmetry about the frequency origin, f=0. By choosing the translating frequencies to be of the form given in the equation above, namely "symmetric" about $f_{CR}$, it can be ensured that the requisite symmetry between $H_1$ and $H_2$ is achieved. Assuming that the prototype filter has a finite impulse response (FIR) with coefficients {$h_0(n)$}, the coefficients of $H_1$ and $H_2$, denoted by {$h_1(n)$} and {$h_2(n)$}, respectively, are then $$h_1(n) = h_0(n)\cos((2\pi f_1/f_1)n); h_2(n) = h_0(n)\cos((2\pi f_2/f_1)n)$$

Other embodiments may use prototype filters in an infinite impulse response (IIR) implementation.

When using DSP techniques it is quite common to employ complex arithmetic. For example, the frequency down-conversion depicted in FIG. 4 may provide a complex form, often called the inphase and quadrature components, and the samples from the A/D converter are then complex valued. In this situation, referring to FIG. 5, there will be power only for positive frequencies. The appropriate filters $H_1$ and $H_2$ in this case are obtained as $$h_1(n) = h_0(n)\exp(j(2\pi f_1/f_s)n); h_2(n) = h_0(n)\exp(j(2\pi f_2/f_s)n)$$

Practical Applications of the Invention

A practical application of the invention that has value within the technological arts is global positioning. There are virtually innumerable uses for the invention, all of which need not be detailed here.

One application of the invention is to get initial carrier acquisition, for example in a CDMA (code division multiple access) system, where actual carrier tracking is often done using a code tracking loop. Thus, one application of the invention is to provide a good estimate of the carrier frequency to acquire the pilot code provided in CDMA.

All the disclosed embodiments of the invention described herein can be realized and practiced without undue experimentation. Although the best mode of carrying out the invention contemplated by the inventors is disclosed above, practice of the invention is not limited thereto. Accordingly, it will be appreciated by those skilled in the art that the invention may be practiced otherwise than as specifically described herein.

For example, although the carrier tracking technology described herein can be a separate module, it will be manifest that the carrier tracking technology may be integrated into the system with which it is associated. Furthermore, all the disclosed elements and features of each disclosed embodiment can be combined with, or substituted for, the disclosed elements and features of every other disclosed embodiment except where such elements or features are mutually exclusive.

It will be manifest that various additions, modifications and rearrangements of the features of the invention may be made without deviating from the spirit and scope of the underlying inventive concept. It is intended that the scope of the invention as defined by the appended claims and their equivalents cover all such additions, modifications, and rearrangements. The appended claims are not to be interpreted as including means-plus-function limitations, unless such a limitation is explicitly recited in a given claim using the phrase "means-for." Expedient embodiments of the invention are differentiated by the appended subclaims.

What is claimed is:

1. A method for tracking a center frequency of a signal having substantially equal spectral power content on both sides of the center frequency, said method comprising:
   making an estimate of the center frequency;
   filtering an upper sideband of the signal above the center frequency to produce a first output having a first spectral power content and a lower sideband of the signal below the center frequency to produce a second output having a second spectral power content; and
   revising the estimate of the center frequency based on a difference between the first spectral power content and the second spectral power content.

2. The method of claim 1, wherein filtering includes using a first filter to produce the first output and using a second filter to produce the second output, and the first filter is matched with the second filter.

3. The method of claim 1, wherein the first output and the second output are produced in parallel.

4. The method of claim 1, wherein the first output and the second output are produced sequentially.

5. The method of claim 1, further comprising shifting the signal to a lower frequency before filtering the signal.

6. The method of claim 1, wherein the center frequency is within a radio frequency band.

7. The method of claim 2, wherein a center frequency $f_1$ of the first filter varies in accordance with $$f_1 = f_{CR} + \Delta f$$

and a center frequency $f_2$ of the second filter varies in accordance with $$f_2 = f_{CR} - \Delta f$$

where $f_{CR}$ is the estimate of the center frequency and $\Delta f$ is a change in frequency.

8. The method of claim 7, wherein both the first filter and the second filter have a finite impulse response (FIR) with coefficients $h_0(n)$, and coefficients of the first filter $h_1(n)$ vary in accordance with $$h_1(n) = h_0(n)\cos((2\pi f_1/f_s)n)$$

and coefficients of the second filter $h_2(n)$ vary in accordance with $$h_2(n) = h_0(n)\cos((2\pi f_2/f_s)n)$$

where $f_s$ is a sampling rate and $f_1 \neq f_2$.

9. The method of claim 7, wherein the first filter and the second filter are matched with a digital signal processor.

10. The method of claim 9, wherein both the first filter and the second filter have a finite impulse response (FIR) with coefficients $h_0(n)$, and coefficients of the first filter $h_1(n)$ vary in accordance with $$h_1(n) = h_0(n)\exp(j(2\pi f_1/f_s)n)$$

and coefficients of the second filter vary in accordance with $$h_2(n) = h_0(n)\exp(j(2\pi f_2/f_s)n)$$

where $f_s$ is a sampling rate and $f_1 \neq f_2$.

11. The method of claim 7, wherein a first frequency response is nonzero only for frequencies less than the estimate of the center frequency, and a second frequency response is nonzero only for frequencies greater than the estimate of the center frequency.

12. The method of claim 7, wherein a first frequency response is substantially zero for frequencies less than the estimate of the center frequency, and a second frequency response is substantially zero for frequencies greater than the estimate of the center frequency.

13. The method of claim 7, wherein a first frequency response has a first bandwidth and a second frequency response has a second bandwidth and both the first bandwidth and the second bandwidth are less than half a bandwidth of the signal.

14. The method of claim 7, wherein a first frequency response has a first bandwidth and a second frequency response has a second bandwidth and both the first bandwidth and the second bandwidth are greater than half a bandwidth of the signal.

15. The method of claim 7, wherein a first shape of a first frequency response is identical to a second shape of a second frequency response, such that the first frequency response is equivalent to a frequency shifted version of the second frequency response.

16. The method of claim 7, wherein a first shape of a first frequency response and a second shape of a second frequency response are substantially triangular.

17. The method of claim 7, wherein both a first shape of a first frequency response and a second shape of a second frequency response are substantially pulse-shaped.

18. The method of claim 7, wherein the first filter and the second filter are substantially finite impulse response filters.

19. The method of claim 7, wherein the first filter and the second filter are substantially infinite impulse response filters.

20. The method of claim 13, wherein the first frequency response is a baseband response shifted in frequency by a first amount and the second frequency response is the baseband response shifted in frequency by a second amount.

21. The method of claim 1, wherein the signal includes a carrier component.

22. The method of claim 1, wherein the signal is modulated with a suppressed carrier modulation.

23. A method of initially acquiring a carrier of a signal comprising the method of claim 1.

24. The method of claim 23, further comprising tracking the carrier using a code tracking loop.

25. The method of claim 23, further comprising acquiring a pilot code in a code division multiple access system.

26. An apparatus for tracking a center frequency of a signal having substantially equal spectral power content on both sides of the center frequency, said apparatus comprising:

a first filter for producing a first output from an upper sideband of the signal above the center frequency;

a second filter for producing a second output from a lower sideband of the signal below the center frequency, the second filter matched with the first filter; and a set of processing resources for making an estimate of the center frequency, calculating the spectral power contents of the first output and the second output, and revising the estimate of the center frequency based on a difference between the spectral power contents of the first output and the second output the set of processing resources being coupled to the first filter and the second filter.

27. The apparatus of claim 26, wherein a center frequency $f_1$ of the first filter varies in accordance with $$f_1 = f_{CR} + \Delta f$$

and a center frequency $f_2$ of the second filter varies in accordance with $$f_2 = f_{CR} - \Delta f$$

where $f_{CR}$ is the estimate of the center frequency and $\Delta f$ is a change in frequency.

28. The apparatus of claim 27, wherein both the first filter and the second filter has a finite impulse response (FIR) with coefficients $h_0(n)$, and coefficients of the first filter $h_1(n)$ vary in accordance with $$h_1(n) = h_0(n)\cos((2\pi f_1/f_s)n)$$

and coefficients of the second filter $h_2(n)$ vary in accordance with $$h_2(n) = h_0(n)\cos((2\pi f_2/f_s)n)$$

where $f_s$ is a sampling rate and $f_1 \neq f_2$.

29. The apparatus of claim 27, wherein the set of processing resources includes a digital signal processor.

30. The apparatus of claim 29, wherein both the first filter and the second filter have a finite impulse response (FIR) with coefficients $h_0(n)$, and coefficients of the first filter $h_1(n)$ vary in accordance with $$h_1(n)=h_0(n)\exp(j(2\pi f_1/f_s)n)$$

and coefficients of the second filter vary in accordance with $$h_2(n)=h_0(n)\exp(j(2\pi f_2/f_s)n)$$

where $f_s$ is a sampling rate and $f_1 \neq f_2$.

31. A receiver, comprising:
an antenna for receiving a signal;
an oscillator coupled to the antenna, the oscillator making an estimate of a carrier frequency of the signal;
first processing resources for digitizing the signal, the first processing resources coupled to the antenna;
a first filter for producing a first output from an upper sideband of the signal above the estimate of the carrier frequency, the first filter coupled to the first processing resources;
a second filter for producing a second output from a lower sideband of the signal below the estimate of the center frequency, the second filter matched with the first filter such that the second filter is symmetrical with the first filter about the estimate of the carrier frequency, and the second filter coupled to the first processing resources; and
second processing resources for generating an error estimate of the estimate of the carrier frequency, and the second processing resources coupled to the oscillator.

32. The receiver of claim 31, further comprising a loop filter for smoothing out noise in the error estimate, the loop filter being coupled to the oscillator.

33. The receiver of claim 31, wherein a center frequency $f_1$ of the first filter varies in accordance with $$f_1 = f_{CR} + \Delta f$$

and a center frequency $f_2$ of the second filter varies in accordance with $$f_2 = f_{CR} - \Delta f$$

where $f_{CR}$ is the estimate of the center frequency and $\Delta f$ is a change in frequency.

34. The receiver of claim 32, wherein both the first filter and the second filter have a finite impulse response (FIR) with coefficients $h_0(n)$, and coefficients of the first filter $h_1(n)$ vary in accordance with $$h_1(n)=h_0(n)\cos((2\pi f_1/f_s)n)$$

and coefficients of the second filter $h_2(n)$ vary in accordance with $$h_2(n)=h_0(n)\cos((2\pi f_2/f_s)n)$$

where $f_s$ is a sampling rate and $f_1 \neq f_2$.

35. The receiver of claim 33, wherein the set of processing resources includes a digital signal processor.

36. The receiver of claim 35, wherein both the first filter and the second filter have a finite impulse response (FIR) with coefficients $h_0(n)$, and coefficients of the first filter $h_1(n)$ vary in accordance with $$h_1(n)=h_0(n)\exp(j(2\pi f_1/f_s)n)$$

and coefficients of the second filter vary in accordance with $$h_2(n)=h_0(n)\exp(j(2\pi f_2/f_s)n)$$

where $f_s$ is a sampling rate and $f_1 \neq f_2$.

37. An apparatus for tracking a center frequency of a signal having substantially equal spectral power content on both sides of the center frequency, the apparatus comprising:
a first filter means for producing a first output from an upper sideband of the signal above the center frequency;
a second filter means for producing a second output from a lower sideband of the signal below the center frequency, the second filter matched with the first filter; and
processing means for making an estimate of the center frequency, calculating the spectral power contents of the first output and the second output, and revising the estimate of the center frequency based on the spectral power contents of the first output and the second output, said processing means coupled to both the first filter means and the second filter means.

38. The apparatus of claim 37, further comprising a third filter means for smoothing out noise in the error estimate, the third filter means being coupled to the processing means.

39. The apparatus of claim 37, wherein a center frequency $f_1$ of the first filter means varies in accordance with $$f_1 = f_{CR} + \Delta f$$

and a center frequency $f_2$ of the second filter means varies in accordance with $$f_2 = f_{CR} - \Delta f$$

where $f_{CR}$ is the estimate of the center frequency and $\Delta f$ is a change in frequency.

40. The apparatus of claim 39, wherein both the first filter means and the second filter means have a finite impulse response (FIR) with coefficients $h_0(n)$, and coefficients of the first filter means $h_1(n)$ vary in accordance with $$h_1(n)=h_0(n)\cos((2\pi f_1/f_s)n)$$

and coefficients of the second filter means $h_2(n)$ vary in accordance with $$h_2(n)=h_0(n)\cos((2\pi f_2/f_s)n)$$

where $f_s$ is a sampling rate and $f_1 \neq f_2$.

41. The apparatus of claim 39, wherein the processing means includes a digital signal processor.

42. The apparatus of claim 41, wherein both the first filter means and the second filter means have a finite impulse response (FIR) with coefficients $h_0(n)$, and coefficients of the first filter means $h_1(n)$ vary in accordance with $$h_1(n)=h_0(n)\exp(j(2\pi f_1/f_s)n)$$

and coefficients of the second filter means vary in accordance with $$h_2(n)=h_0(n)\exp(j(2\pi f_2/f_s)n)$$

where $f_s$ is a sampling rate and $f_1 \neq f_2$.

* * * * *

UNITED STATES PATENT AND TRADEMARK OFFICE
CERTIFICATE OF CORRECTION

PATENT NO. : 6,724,835 B1
DATED : April 20, 2004
INVENTOR(S) : Emmanuel Vyers

It is certified that error appears in the above-identified patent and that said Letters Patent is hereby corrected as shown below:

<u>Title page,</u>
Item [73], Assignee, delete "Symmetricam, Inc." and isert -- Symmetricom --

Signed and Sealed this

Twenty-ninth Day of June, 2004

JON W. DUDAS
*Acting Director of the United States Patent and Trademark Office*